United States Patent
Schmidt

(10) Patent No.: US 6,763,323 B2
(45) Date of Patent: Jul. 13, 2004

(54) RESOLUTION FILTER FOR A SPECTRUM ANALYZER

(75) Inventor: Kurt Schmidt, Grafing (DE)

(73) Assignee: Rohde & Schwarz GmbH & Co KG (DE)

( * ) Notice: Subject to any disclaimer, the term of this patent is extended or adjusted under 35 U.S.C. 154(b) by 42 days.

(21) Appl. No.: 10/062,563

(22) Filed: Feb. 5, 2002

(65) Prior Publication Data

US 2002/0135351 A1 Sep. 26, 2002

(30) Foreign Application Priority Data

Feb. 6, 2001 (DE) .......................................... 101 05 258

(51) Int. Cl.⁷ .................... G01R 13/24; G06F 17/10; G06F 15/00
(52) U.S. Cl. .................... 702/190; 324/76.27; 708/300
(58) Field of Search .................... 324/76.19, 76.21, 324/76.28, 76.29, 76.31, 76.27; 702/190, 76, 77; 708/300; 333/166, 167

(56) References Cited

U.S. PATENT DOCUMENTS 5,075,619 A * 12/1991 Said ........................ 324/76.31
5,706,202 A * 1/1998 Itahara et al. ................. 702/77
5,926,793 A 7/1999 de Rafael et al.
6,275,020 B1 * 8/2001 Nagano .................... 324/76.27

FOREIGN PATENT DOCUMENTS

DE 196 27 784 C1 6/1997
DE 196 27 788 A1 1/1998

OTHER PUBLICATIONS

Mallat, A wavelet Tour of Signal Processing, 1998, 1999, Academic Press, Second Edition, pp. 2,3,71 and 87.*

* cited by examiner

Primary Examiner—Albert Decady
Assistant Examiner—James Kerveros
(74) Attorney, Agent, or Firm—Ditthavong & Carlson, P.C.

(57) ABSTRACT

A spectrum analyzer comprises a mixer, which mixes complex conjugate input signal v*(t) into a base band signal x(t) and a resolution filter, which filters the base band signal for narrow band. In accordance with two aspects of the invention, the resolution filter has either a complex pulse response $h_{used}(t)=C_1 \cdot e^{-C_2 \cdot t^2} \cdot e^{-j \cdot C_3 \cdot t^2}$ or a real pulse response $h_{used}(t)=C_4 \cdot e^{-C_5 \cdot t^2}$, in which $C_1$, $C_2$, $C_3$, $C_4$ and $C_5$ are constants.

6 Claims, 1 Drawing Sheet

RESOLUTION FILTER FOR A SPECTRUM ANALYZER

FIELD OF THE INVENTION

The present invention relates to a resolution filter for a spectrum analyzer.

BACKGROUND OF THE INVENTION

During a spectrum analysis, a predetermined frequency range is swept with a resolution filter that has a predetermined band width, which is why the resolution filter is also referred to as a sweep filter. One resolution filter for a spectrum analyzer with an analog construction is described for instance in U.S. Pat. No. 5,736,845. With resolution filters which have a conventional analog construction, it is possible to achieve only a limited sweeping speed, referred to as the K-factor, which determines and limits how fast the sweeping is conducted in conventional resolution filters.

It has been generally assumed up until now that sweeping can be conducted within $T_{res}$ with an order of magnitude of $1/B_{res} = T_{res}$ so that the resolution filter would be still able to respond. This statement has been taught as a fact, similar to the time law in information technology. In any case, this statement is correct only if it is based on the principle of a fixed filter for all sweeping speeds.

Therefore, there is a need for a resolution filter that makes it possible to achieve an optimal resolution with a high sweeping speed.

SUMMARY OF THE INVENTION

These and other needs are addressed by a resolution filter that has either a complex pulse response $h_{used}(t) = C_1 \cdot e^{-C_2 \cdot t^2} \cdot e^{-j \cdot C_3 \cdot t^2}$ or a real pulse response $h_{used}(t) = C_4 \cdot e^{-C_5 \cdot t^2}$, in which $C_1$, $C_2$, $C_3$, $C_4$ and $C_5$ are constants. Accordingly, sweeping can be conducted even with an infinite speed with an optimal complex resolution filter, without causing by this occurrences of amplitude and band width errors.

It has been further also shown that, although sweeping cannot be conducted with an unlimited speed in case of a real resolution filter, it is still possible to achieve a minimum K-factor of $K_{min} = 0.88$. Definition of the K factor: sweeping is conducted within $T_{res}$ with $1/K \cdot B_{res}$.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

An apparatus and method for a resolution filter are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
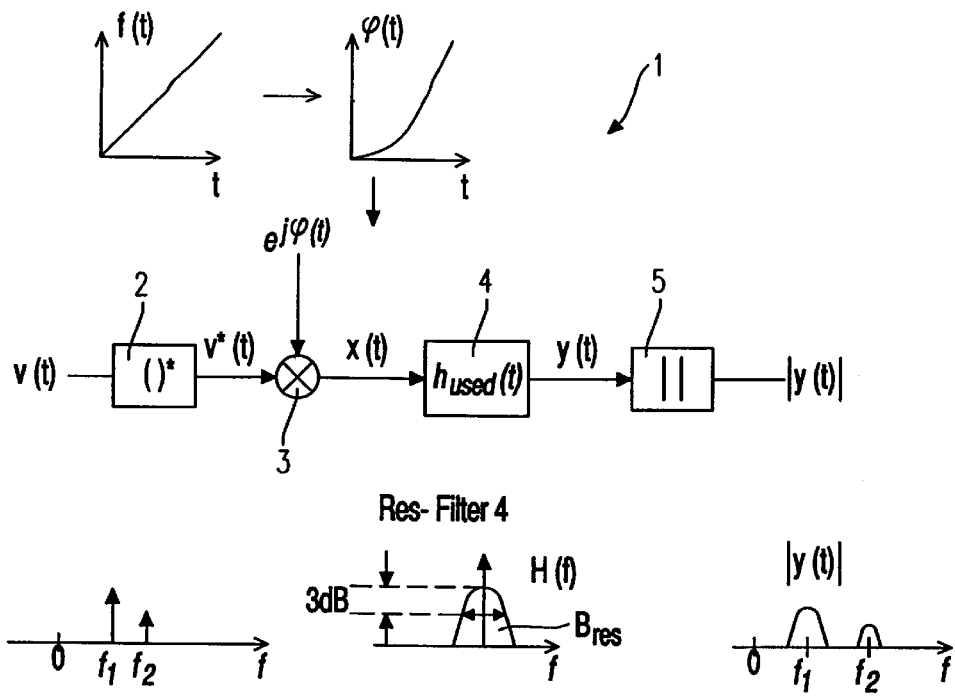
FIG. 1 is a block diagram of a spectrum analyzer with an equivalent base band in accordance with an embodiment of the present invention.

FIG. 1 shows a simplified block diagram of a spectrum analyzer 1. The complex input signal v(t) to be analyzed is supplied to a conjugate complex generator 2, which forms the complex conjugate signal v*(t) of the input signal v(t). The complex conjugate input signal v*(t) is mixed downward by multiplication with the sweep signal $e^{j\Phi(t)}$ in the base band signal x(t). In the upper part of FIG. 1, the frequency f(t) of the sweep signal is represented as a function of time t, and as one can see, the sweep frequency f(t) changes linearly with the time t. Through integration, phase angle $\phi(t)$ can be obtained as a function of the time t. The base band signal x(t) is supplied according to this invention to a resolution filter 4. The base band signal x(t) is folded in the resolution filter 4 with the pulse response $h_{used}(t)$. This creates an output signal y(t). The quantity |y(t)| of the signal y(t) is generated by an absolute value amplifier 5.

In the lower part of FIG. 1 is shown for instance an output signal v(t) which has a spectrum that comprises two discrete spectral lines. An example of the transfer function H(t) of the resolution filter 4 is further also indicated. This is located at the output of the spectrum analyzer 1 on the right side next to the depicted spectrum, wherein the spectral lines are widened by the resolution band width $B_{res}$ of the resolution filter 4. The resolution width $B_{res}$ corresponds to the band width with an attenuation of −3 dB relative fto the maximum.

The spectrum of the signal v(t) is at first modified with the pulse response of the resolution filter and then according to $$S(f) = \int_{-\infty}^{\infty} v(\tau) h_{res}(\tau) \cdot e^{-j\omega\tau} d\tau = H_{res}(f) * V(f) \quad (1)$$

which performs a Fourier transform.

An interesting issue here is the correlation of the spectrum with white noise. The correlation serves to describe in which interval is the spectrum uncorrelated. The ACF (auto correlation function) of the input signal is in case of white noise described by the following $$E\{v(\tau)v^*(\tau+dt)\} = \underbrace{2}_{real/imag} \cdot N_0/2 \delta(dt) \quad (2)$$

The ACF of the Fourier spectrum is obtained by the application of equation (1)

$$E\{S^*(f) \cdot S(f+df)\} = E\Big\{ \int_{-\infty}^{\infty} v^*(\tau_1) h_{res}^*(\tau_1) \cdot e^{j\omega\tau_1} d\tau_1 \cdot \int_{-\infty}^{\infty} v(\tau_2) h_{res}(\tau_2) \cdot e^{-j(\omega+d\omega)\tau_2} d\tau_2 \Big\}$$

-continued $$= \int_{-\infty}^{\infty}\int_{-\infty}^{\infty} E\{v^*(\tau_1) \cdot v(\tau_2)\} h_{res}^*(\tau_1) \cdot$$

$$h_{res}(\tau_2) e^{-j\omega(\tau_1-\tau_2)} e^{-jd\omega\tau_2} d\tau_1 d\tau_2$$

Application of equation (2) results in $\tau_1 = \tau_2 := \tau$ $$E\{S^*(f) \cdot S(f + df)\} = \int_{-\infty}^{\infty} N_0 h_{res}^*(\tau) \cdot h_{res}(\tau) e^{-jd\omega\tau} d\tau$$

$$= N_0 \int_{-\infty}^{\infty} |h_{res}(\tau)|^2 \cdot e^{-jd\omega\tau} d\tau$$

$$= N_0 \cdot F\{|h_{res}(\tau)|^2\}$$

The following is true about a Gaussian filter:

$$h_{gauss}(t) = \sqrt{\frac{\pi}{2\ln(2)}} B_{res} \cdot e^{-\frac{\pi^2}{2\ln(2)}\left(\frac{t}{T_{res}}\right)^2} \quad (3)$$

$$H_{gauss}(f) = e^{-2\ln(2)\left(\frac{f}{B_{res}}\right)^2}$$

From equation (3) follows:

$$R_h(\tau) = F^{-1}\{|H_{gauss}(f)|^2\} \quad (4)$$

$$= F^{-1}\left\{e^{-2\ln(2)\cdot 2\left(\frac{f}{B_{res}}\right)^2}\right\} \quad \text{with } B'_{res} = B_{res}/\sqrt{2}$$

$$= \sqrt{\frac{\pi}{2\ln(2)}} \cdot B'_{res} \cdot e^{-\frac{\pi^2}{2\ln(2)}\left(\frac{\tau}{T'_{res}}\right)^2} \quad \text{with } T'_{res} = T_{res}\sqrt{2}$$

$$= \underbrace{\sqrt{\frac{\pi}{2\ln(2)}} \cdot B_{res}/\sqrt{2}}_{:=B_{noise}} \cdot e^{-\frac{\pi^2}{2\ln(2)}\left(\frac{\tau}{\sqrt{2}\cdot T_{res}}\right)^2}$$

It further follows from equation (4):

$$F\{|h_{gauss}(t)|^2\} = F\left\{\frac{\pi}{2\ln(2)} B_{res}^2 e^{-\frac{\pi^2}{2\ln(2)}\cdot 2\left(\frac{t}{T_{res}}\right)^2}\right\} \quad \text{with } T'_{res} = T_{res}/\sqrt{2} \quad (5)$$

$$= \frac{\frac{\pi}{2\ln(2)} B_{res}^2}{\left(\frac{\pi}{2\ln(2)}\right)^{1/2} B'_{res}} \cdot e^{-2\ln(2)\left(\frac{f}{B'_{res}}\right)^2} \quad \text{with } B'_{res} = B_{res}\sqrt{2}$$

$$= \underbrace{\sqrt{\frac{\pi}{2\ln(2)}} B_{res}/\sqrt{2}}_{B_{noise}} \cdot e^{-\ln(2)\left(\frac{f}{B_{res}}\right)^2}$$

With a Gaussian filter the following is obtained from equation(5):

$$E\{S^*(f) \cdot S(f + df)\} = N_0 \cdot B_{noise} \cdot e^{-\ln(2)\left(\frac{df}{B_{res}}\right)^2} \quad (6)$$

FIG. 1 shows a block diagram of a spectrum analyzer in an equivalent base band. It should be noted that the HF signal v(t) to be examined is considered in an equivalent base band for the purposes of a simple model (that is to say, there are no spectral components with f<0). After the formation of v*(t) multiplication is performed with the revolution indicator $e^{j\Phi(t)}$ and the result is $$x(t) = v^*(t) \cdot e^{j\Phi(t)} \quad (7)$$

The frequency of the revolution indicator is increased according to $$f(t) = \frac{1}{K} \cdot B_{res}^2 \cdot t \quad (8)$$

linearly with time. The K factor determines how fast sweeping will be conducted. Since the resolution filter requires an approximate response time of $T_{res}$, the frequency should be changed within $T_{res}$ at the most by $B_{res}$, which still corresponds according to Equation (8) to a maximum K factor of K=1. Through integration will be obtained the phase $$\varphi(t) = \int_{-\infty}^{t} 2\pi f(t) dt = \frac{\pi}{K} \cdot B_{res}^2 \cdot t^2 \quad (9)$$

The signal x(t) will then be filtered through the resolution filter with the pulse response $h_{used}(t)$ and the output singal y(t) is created. Based on this output signal, the envelope |y(t)| is determined and will be generally logarithmically represented on the spectrum analyzer.

The output signal is obtained with $$y(t) = x(t) * h_{used}(t) = \int_{-\infty}^{\infty} h_{used}(\tau) \cdot x(t - \tau) d\tau$$

By the application of Equation (7), the following is obtained $$y(t) = \int_{-\infty}^{\infty} h_{used}(\tau) \cdot v^*(t - \tau) e^{j\varphi(t-\tau)} d\tau$$

Finally, by the application of Equation (9), the following is obtained $$y(t) = \int_{-\infty}^{\infty} h_{used}(\tau) \cdot v^*(t - \tau) e^{j\frac{\pi}{K} \cdot B_{res}^2 \cdot (t-\tau)^2} d\tau$$

By multiplying out 0s, the following is obtained $$y(t) = \underbrace{e^{j\frac{\pi}{K} \cdot B_{res}^2 \cdot t^2}}_{e^{j\varphi(t)}} \int_{-\infty}^{\infty} \underbrace{h_{used}(\tau) e^{j\frac{\pi}{K} \cdot B_{res}^2 \cdot \tau^2}}_{h_{disp}(\tau)} \cdot v^*(t - \tau) e^{-j2\frac{\pi}{K} \cdot B_{res}^2 \cdot t\tau} d\tau \quad (10)$$

wherein the first term $e^{j\Phi(t)}$ is not in the way because |y(t)| will be used in the end for indication. The pulse response below is introduced into the equation $$h_{disp}(t) = h_{used}(t) \cdot e^{j\frac{\pi}{K} B_{res}^2 t^2} \quad (11)$$

The subscript stands for "displayed," because it will be shown later that the spectrum having this impulse response serves for indication.

From Equation (8), the following is obtained through transformation:

$$t = \frac{f(t) \cdot K}{B_{res}^2} \quad (12)$$

By application in Equation (10) will be obtained $$y(t) = e^{j\varphi(t)} \int_{-\infty}^{\infty} h_{disp}(\tau) \cdot v^*(t-\tau) e^{-j\omega(t)\tau} d\tau \qquad (13)$$

Several interesting statements can now be established based on a comparison of equation (13) with the Fourier analysis in equation (1):

1. It is not the utilized resolution filter $h_{used}(t)$, but rather the "displayed" resolution filter $h_{disp}(t)$ described according to equation (11) that serves for indication. With a slow sweep for approximately $K \geq 2$, there will be an approximate coincidence between $h_{used}(t)$ and $h_{disp}(t)$. Distinct differences, however, will become apparent with a fast sweep. In this case, the level indicator caves in and the displayed resolution filter is broader (the filter can no longer respond).
2. In equation (13), in contrast to Fourier analysis, $v(\tau)$ is not used, as the time signal adjusted with t is used instead. Therefore, the spectrum analyzer evaluates an observation interval that is gliding in time, which is no longer interfering. Worthy of note is the question as to what kind influence has the speed of the gliding observation window on the output spectrum.

In order to make it possible to give an opinion on the question of the gliding observation window, the Parseval's theorem can be applied to equation (13) according to $$\int_{-\infty}^{\infty} x_1(\tau) \cdot x_2^*(\tau) d\tau = \int_{-\infty}^{\infty} X_1(F) \cdot X_2^*(F) dF$$

Through the substitution of $$x_1(\tau) = h_{disp}(\tau) \cdot e^{-j\omega(t)\tau} \xrightarrow{T} X_1(F) = H_{disp}(F + f(t))$$

$$x_2(\tau) = v(t-\tau) \xrightarrow{T} X_2(F) = V(-F) \cdot e^{j2\pi Ft}$$

Equation (13) can be described by $$y(t) = e^{j\varphi(t)} \int_{-\infty}^{\infty} H_{disp}(F + f(t)) \cdot V^*(-F) e^{-j2\pi Ft} dF \qquad (14)$$

$$= e^{j\varphi(t)} \int_{-\infty}^{\infty} H_{disp}(F - f(t)) \cdot V^*(F) e^{-j2\pi Ft} dF$$

One can thus obtain as expected a convolution of the input spectrum with the resolution filter according to $$y(t) = e^{j\varphi(t)} H_{disp}(f(t)) * [V^*(f(t)) e^{-j2\pi t f(t)}]$$

The application of equation (12) in equation (14) finally results in $$y(t) = e^{j\varphi(t)} \int_{-\infty}^{\infty} H_{disp}(F - f(t)) \cdot V^*(F) e^{-j\frac{2\pi K}{B_{res}^2} F f(t)} dF \qquad (15)$$

The following is an explanation of an embodiment of the complex resolution filter according to the invention.

A resolution filter having a Gaussian form with a bandwidth $B_{res}$ is used for spectrum analysis. The "displayed" resolution filter should have the pulse response and transfer function $$h_{disp}(t) = \sqrt{\frac{\pi}{2\ln(2)}} B_{res} \cdot e^{-\frac{\pi^2}{2\ln(2)} \left(\frac{t}{T_{res}}\right)^2} \qquad (16)$$

$$H_{disp}(f) = e^{-2\ln(2)\left(\frac{f}{B_{res}}\right)^2}$$

Correct amplitude representation of the spectral lines is ensured with $H_{disp}(f=0)=1$.

A linear phase filter is utilized in equation (16), although this is not absolutely necessary. It should be noted that the component $H_{disp}(f)$ must have a Gaussian form, that is to say the phase can not be random. The degree of freedom of the phase can be used in the design so that the filter is designed with a minimal phase. This will reduce the group transit time delay relative to the linear phase filter approximately by half. This will be also further explained later.

The resolution filter to be used will result according to equation (11) in the rule $$h_{used}(t) = h_{disp}(t) \cdot e^{-j\frac{\pi}{K} B_{res}^2 t^2} \qquad (17)$$

Through application will be obtained $$h_{used}(t) = \sqrt{\frac{\pi}{2\ln(2)}} B_{res} \cdot e^{-\frac{\pi^2}{2\ln(2)}\left(\frac{t}{T_{res}}\right)^2} \cdot e^{-j\frac{\pi}{K} B_{res}^2 t^2} \qquad (18)$$

Equation (18) can be generalized so that it is described in the form $$h_{used}(t) = C_1 \cdot e^{-C_2 t^2} \cdot e^{-jC_3 t^2}$$

wherein $C_1$, $C_2$ and $C_3$ are constants.

One can see from equation (18) that the pulse response of the "used" filter is complex. This solution is therefore possible only when the possibility of complex filtering exists.

The following is valid:

$$h(t) = e^{-at^2} \cdot e^{-jbt^2} \qquad (19)$$

$$H(f) = \frac{\sqrt{\pi}}{(a^2+b^2)^{1/4}} \cdot e^{-\frac{a}{4(a^2+b^2)}\omega^2} \cdot e^{+j\left[\frac{b}{4(a^2+b^2)}\omega^2 - 1/2 \cdot \arctan(b/a)\right]}$$

With an optimal complex resolution filter, the following must be applied in equation (19)

$$a = \frac{\pi^2}{2\ln(2)} \cdot B_{res}^2$$

$$b = \frac{\pi}{K} \cdot B_{res}^2$$

After intermediate calculations, the result will be $$h_{used}(t) = \underbrace{\sqrt{\frac{\pi}{2\ln(2)}} B_{res} \cdot e^{-\frac{\pi^2}{2\ln(2)}\left(\frac{t}{T_{res}}\right)^2} \cdot e^{-j\frac{\pi}{K} B_{res}^2 t^2}}_{h_{disp}(t)} \quad (20)$$

$$H_{used}(f) = Factor^{1/4} \cdot e^{-2\ln(2)\cdot Factor\left(\frac{f}{B_{res}}\right)^2} \cdot e^{j\left[\frac{\pi}{K\cdot Denom}\left(\frac{f}{B_{res}}\right)^2 - 1/2\arctan\left(\frac{2\ln(2)}{\pi\cdot K}\right)\right]}$$

with $$Denom = \left(\frac{\pi}{2\ln(2)}\right)^2 + \left(\frac{1}{K}\right)^2 \quad (21)$$

$$Factor = \frac{\left(\frac{\pi}{2\ln(2)}\right)^2}{Denom} = \frac{\left(\frac{\pi}{2\ln(2)}\right)^2}{\left(\frac{\pi}{2\ln(2)}\right)^2 + \left(\frac{1}{K}\right)^2} \leq 1$$

One can see from equation (20) that the bandwidth is increased with the quadratically ascending phase of the pulse response by $1/\sqrt{Factor} \geq 1$. Furthermore, the amplitude caves in by a factor of $Factor^{1/4} \leq 1$.

The transform can be obtained from Equation (20) according to $$H_{used}(f) = \quad (22)$$

$$Factor^{1/4} \cdot e^{-2\ln(2)\cdot Factor\left(\frac{f}{B_{res}}\right)^2} \cdot e^{j\left[\frac{\pi}{K\cdot Denom}\left(\frac{f}{B_{res}}\right)^2 - 1/2\arctan\left(\frac{2\ln(2)}{\pi\cdot K}\right)\right]}$$

with the parameters $$Denom = \left(\frac{\pi}{2\ln(2)}\right)^2 + \left(\frac{1}{K}\right)^2 \quad (23)$$

$$Factor = \frac{\left(\frac{\pi}{2\ln(2)}\right)^2}{Denom} = \frac{\left(\frac{\pi}{2\ln(2)}\right)^2}{\left(\frac{\pi}{2\ln(2)}\right)^2 + \left(\frac{1}{K}\right)^2} \leq 1$$

The following statements can thus be established:
1. The current opinion that the K factor cannot be made smaller than 1 during spectrum analysis because the filter will then no longer respond is incorrect. With a suitable selection of an optimal resolution filter, the sweep can be as fast as desired, that is to say $K \to 0$ is in principle possible.
2. An optimal filter $h_{used}(k)$ depends on the K factor and thus on the sweeping speed. With an increasingly faster sweep, the spectrum analysis will be converging in the direction of Fourier analysis.
3. One can see from equation (22) that the "used" filter $h_{used}(k)$ again involves a Gaussian filter. However, the pulse response is complex.

During a transition to a discrete pulse response, it follows from $$H_{used}(f) = \int_{-\infty}^{\infty} h_{used}(t) e^{-j\omega t} dt = \sum_{-\infty}^{\infty} T_a h_{used}(t=kT_a) e^{-j\omega T_a}$$

for the digital impulse response $h_{used}(k) = T_a h_{used}(t=kT_a)$

By the application of the Equation (18), the following is obtained $$h_{used}(k) = \sqrt{\frac{\pi}{2\ln(2)}} \cdot B_{res}/f_a \cdot e^{-\frac{\pi^2}{2\ln(2)}\left(\frac{t}{T_{res}}\right)^2} \cdot e^{-j\frac{\pi}{K} B_{res}^2 t^2} \Big|_{t=kT_a} \quad (24)$$

$$H_{used}(f) = Factor^{1/4} \cdot e^{-2\ln(2)\cdot Factor\left(\frac{f}{B_{res}}\right)^2} \cdot e^{j\left[\frac{\pi}{K\cdot Denom}\left(\frac{f}{B_{res}}\right)^2 - 1/2\arctan\left(\frac{2\ln(2)}{\pi\cdot K}\right)\right]}$$

with $T_{res}=1/B_{res}$, $B_{res}$=resolution bandwidth for a 3 dB signal loss relative to the maximum and with $f_a$=sampling frequency in the base band.

The following is an explanation of an embodiment of a real resolution filter.

According to equation (11), the following rule is valid $$h_{disp}(t) = h_{used}(t) \cdot e^{j\frac{\pi}{K} B_{res}^2 t^2}$$

It is further also known based on equation (19) that with the pulse response $h_{used}(t)$ which has a Gaussian form, the contributing frequency $|H_{disp}(f)|$ that we are interested in will also have a Gaussian form. However, the quadratically rising phase in Equation (11) will change and bandwidth and the phase frequency characteristics which will be no longer of interest.

The following must be applied with a real resolution filter:

$$a = \frac{\pi^2}{2\ln(2)} \cdot B_{used}^2$$

$$b = -\frac{\pi}{K} \cdot B_{res}^2$$

in Equation (67). From intermediate calculations will be obtained the result $$h_{disp}(t) = Factor^{-1/4} \cdot \underbrace{\sqrt{\frac{\pi}{2\ln(2)}} B_{used} \cdot e^{-\frac{\pi^2}{2\ln(2)}\left(\frac{t}{T_{used}}\right)^2}}_{h_{used}(t)} \cdot e^{j\frac{\pi}{K} B_{res}^2 t^2} \quad (25)$$

$$H_{disp}(f) = e^{-2\ln(2)\cdot Factor\left(\frac{f}{B_{used}}\right)^2} \cdot$$

$$e^{-j\left[\frac{\pi}{K\cdot Denom}\left(\frac{B_{res}}{B_{used}}\right)^2\left(\frac{f}{B_{res}}\right)^2 - 1/2\arctan\left\{\left(\frac{2\ln(2)}{\pi\cdot K}\right)\left(\frac{B_{res}}{B_{used}}\right)^2\right\}\right]}$$

with $$Denom = \left(\frac{\pi}{2\ln(2)}\right)^2 + \left(\frac{1}{K}\right)^2 \cdot \left(\frac{B_{res}}{B_{used}}\right)^4 \quad (26)$$

$$Factor = \frac{\left(\frac{\pi}{2\ln(2)}\right)^2}{Denom} = \frac{\left(\frac{\pi}{2\ln(2)}\right)^2}{\left(\frac{\pi}{2\ln(2)}\right)^2 + \left(\frac{1}{K}\right)^2 \cdot \left(\frac{B_{res}}{B_{used}}\right)^4} \leq 1$$

Assuming that the pulse response $h_{used}(t)$ has a bandwidth $B_{used}$ that is to be further determined, then it can be established from equation (25)

$$h_{disp}(t) = \tag{27}$$

$$\frac{Factor^{-1/4} \cdot \sqrt{\frac{\pi}{2\ln(2)}} B_{used} \cdot e^{-\frac{\pi^2}{2\ln(2)} \left(\frac{t}{T_{used}}\right)^2} \cdot e^{j\frac{\pi}{K} \cdot B_{res}^2 \cdot t^2}}{h_{used}(t)}$$

$$H_{disp}(f) = e^{-2\ln(2) \cdot Factor \left(\frac{f}{B_{used}}\right)^2} \cdot$$

$$e^{-j\left[\frac{\pi}{K \cdot \text{denom}} \left(\frac{B_{res}}{B_{used}}\right)^2 \left(\frac{f}{B_{res}}\right)^2 - 1/2\arctan\left\{\left(\frac{2\ln(2)}{\pi \cdot K}\right)\left(\frac{B_{res}}{B_{used}}\right)^2\right\}\right]}$$

with $$Denom = \left(\frac{\pi}{2\ln(2)}\right)^2 + \left(\frac{1}{K}\right)^2 \cdot \left(\frac{B_{res}}{B_{used}}\right)^4 \tag{28}$$

$$Factor = \frac{\left(\frac{\pi}{2\ln(2)}\right)^2}{Denom} = \frac{\left(\frac{\pi}{2\ln(2)}\right)^2}{\left(\frac{\pi}{2\ln(2)}\right)^2 + \left(\frac{1}{K}\right)^2 \cdot \left(\frac{B_{res}}{B_{used}}\right)^4} \leq 1$$

According to the requirement, the following should be valid $$|H_{disp}(f)| = e^{-2\ln(2) \left(\frac{f}{B_{res}}\right)^2} \tag{29}$$

By comparing Equation (27) to Equation (29), the following rule will be established $$Factor \cdot \frac{1}{B_{used}^2} \stackrel{!}{=} \frac{1}{B_{res}^2} \tag{30}$$

The application of Equation (28) will result in $$\frac{\overbrace{\left(\frac{\pi}{2\ln(2)}\right)^2}^{A}}{\underbrace{\left(\frac{\pi}{2\ln(2)}\right)^2}_{A} + \underbrace{\left(\frac{1}{K}\right)^2}_{C} \cdot \underbrace{\left(\frac{B_{res}}{B_{used}}\right)^4}_{x^2}} \stackrel{!}{=} \underbrace{\left(\frac{B_{used}}{B_{res}}\right)^2}_{1/x}$$

Through a transformation the following is obtained:

$$A + C \cdot x^2 \stackrel{!}{=} A \cdot x \tag{31}$$

Both solutions are obtained with the solution of this quadratic equation:

$$x_{1/2} = \frac{A \stackrel{(+)}{-} \sqrt{A^2 - 4CA}}{2C} \quad \begin{array}{l}(+): \text{small } B_{used} \\ -: \text{large } B_{used}\end{array} \tag{32}$$

Figure 2:
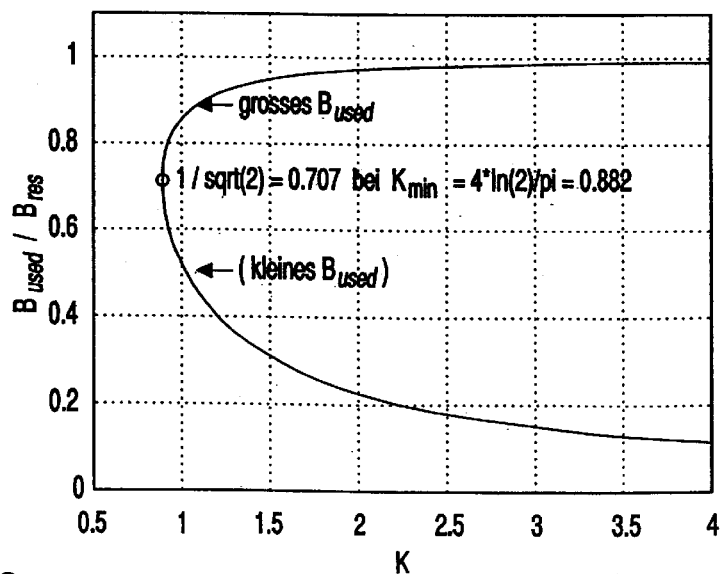
FIG. 2 shows how $B_{used}$ is utilized depending on the K-factor.

As shown below, only the subtraction in equation (32) will lead to a meaningful result, which is why the addition is placed in parentheses. In FIG. 2 are shown both solutions for the bandwidth $B_{used}$ to be used according to equation (32). The addition in equation (32) results in a small $B_{used}$ and this it is not meaningful as a solution, because the duration of the pulse response and therefore the duration of the group transit time of the large $B_{used}$ is greater. The purpose, however, is to achieve as small duration of the group transit time as possible. For this reason the addition in equation (32) was placed in parentheses.

When inserted into equation (32), the result for the case that we are intereseted in (large $B_{used}$) is:

$$\frac{B_{res}^2}{B_{used}^2}(K) = \frac{\left(\frac{\pi}{2\ln(2)}\right)^2 - \sqrt{\left(\frac{\pi}{2\ln(2)}\right)^4 - 4 \cdot \left(\frac{1}{K}\right)^2 \cdot \left(\frac{\pi}{2\ln(2)}\right)^2}}{2 \cdot \left(\frac{1}{K}\right)^2} \tag{33}$$

Several interesting characteristics can be established from FIG. 2:

With a real pulse response $h_{used}(t)$ it is not possible, in contrast to the complex case, to make the K factor as small as desired, that is to say to performe sweeping with an unlimited speed. Which minimum K factor is possible? The radicand in equation (32) must not be negative. It is thus valid with a minimum K that $$A^2 - 4CA = 0$$

By an application will be obtained $$K_{min} = 4 \ln(2)/\pi = 0.8825$$

as one can see from FIG. 2. The following can be further simply derived from equation (32) with a minimum K:

$$\frac{B_{used}}{B_{res}}(K_{min}) = 1/\sqrt{2} = 0.707$$

Therefore, with this maximum sweeping speed, a group transit time delay that is greater by the factor $\sqrt{2}$ emerges when compared to a conventional resolution filter.

An application of the condition in equation (31) will result in a simplification based on equation (28)

$$Factor = \frac{A}{A + C \cdot x^2} \stackrel{!}{=} \frac{1}{x} = \frac{B_{used}^2}{B_{res}^2}$$

An application of equation (27) results in $$h_{disp}(t) = \frac{\sqrt{\frac{B_{res}}{B_{used}}} \cdot \sqrt{\frac{\pi}{2\ln(2)}} B_{used} \cdot e^{-\frac{\pi^2}{2\ln(2)} \left(\frac{t}{T_{used}}\right)^2} \cdot e^{j\frac{\pi}{K} \cdot B_{res}^2 \cdot t^2}}{h_{used}(t)} \tag{34}$$

$$H_{disp}(f) = e^{-2\ln(2) \cdot Faktor \left(\frac{f}{B_{used}}\right)^2} \cdot$$

$$e^{-j\left[\frac{\pi}{K \cdot Nenner} \left(\frac{B_{res}}{B_{used}}\right)^2 \left(\frac{f}{B_{res}}\right)^2 - 1/2\arctan\left\{\left(\frac{2\ln(2)}{\pi \cdot K}\right)\left(\frac{B_{res}}{B_{used}}\right)^2\right\}\right]}$$

The following correspondence occurs with equation (35)

$$h_{used}(t) = \sqrt{\frac{B_{res}}{B_{used}}} \cdot \overbrace{\sqrt{\frac{\pi}{2\ln(2)}} B_{used} \cdot e^{-\frac{\pi^2}{2\ln(2)} \left(\frac{t}{T_{used}}\right)^2}}^{h_{gauss}(t)} \tag{35}$$

$$H_{used}(f) = \sqrt{\frac{B_{res}}{B_{used}}} \cdot e^{-2\ln(2) \left(\frac{f}{B_{used}}\right)^2}$$

Equation (35) can be generalized and written in the form $$h_{used}(t) = C_4 \cdot e^{-C_5 t^2}$$

wherein $C_4$ and $C_5$ are constants.

During a transition to a discrete pulse response, it follows from $$H_{used}(f) = \int_{-\infty}^{\infty} h_{used}(t)e^{-j\omega t}dt = \sum_{-\infty}^{\infty} T_a h_{used}(t=kT_a)e^{-j\omega T_a}$$

for the digital pulse response $$h_{used}(k) = T_a h_{used}(t=kT_a)$$

By the application of equation (35), the following is finally obtained $$h_{used}(k) = \sqrt{\frac{B_{res}}{B_{used}}} \cdot \sqrt{\frac{\pi}{2\ln(2)}} \cdot B_{used}/f_a \cdot e^{-\frac{\pi^2}{2\ln(2)}\left(\frac{t}{T_{used}}\right)^2}\bigg|_{t=kT_a} \quad (36)$$

$$H_{used}(f) = \underbrace{\sqrt{\frac{B_{res}}{B_{used}}}}_{\geq 1} \cdot e^{-2\ln(2)\left(\frac{f}{B_{used}}\right)^2}$$

that is to say that with the used filter, an amplification of $f=0$ will occur.

While the present invention has been described in connection with a number of embodiments and implementations, the present invention is not so limited but covers various obvious modifications and equivalent arrangements, which fall within the purview of the appended claims.

What is claimed is:

1. A spectrum analyzer, comprising a resolution filter for filtering a base band signal for a narrow band and having a complex pulse response $h_{used}(t)$ of $$h_{used}(t) = C_1 \cdot e^{-C_2 \cdot t^2} \cdot e^{-j \cdot C_3 \cdot t^2}$$

wherein $C_1$, $C_2$ and $C_3$ are constants, wherein constant $C_3$ equals $$C_3 = \frac{\pi}{K} \cdot B_{res}^2$$

wherein $B_{res}$ is a bandwidth of the resolution filter and K is a K-factor of the resolution filter, while the K factor is defined by the equation $$f(t) = \frac{1}{K} \cdot B_{res}^2 \cdot t$$

and f(t) is a variable frequency linear with time t, that is supplied to a mixer coupled in series with the resolution filter of the spectrum analyzer.

2. A spectrum analyzer according to claim 1, wherein constant $C_1$ equals $$C_1 = \sqrt{\frac{\pi}{2\ln(2)}} \cdot B_{res}.$$

wherein $B_{res}$ is a bandwidth of the resolution filter.

3. A spectrum analyzer according to claim 1, wherein constant $C_2$ equals $$C_2 = \frac{\pi^2}{2\ln(2)} \cdot \frac{1}{T_{res}^2};$$

wherein $T_{res}=1/B_{res}$ is a reciprocal bandwidth $B_{res}$ of the resolution filter.

4. A spectrum analyzer, comprising resolution filter having a pulse response $h_{used}(t)$ of:

$$h_{used}(t) = C_4 \cdot e^{-C_5 \cdot t^2}$$

wherein $C_4$ and $C_5$ are constants, wherein constant $C_4$ equals $$C_4 = \sqrt{\frac{B_{res}}{B_{used}}} \cdot \sqrt{\frac{\pi}{2\ln(2)}} \cdot B_{used}$$

wherein $B_{res}$ is a bandwidth of the resolution filter and $B_{used}$ is defined by:

$$\frac{B_{res}^2}{B_{used}^2} = \frac{\left(\frac{\pi}{2\ln(2)}\right)^2 - \sqrt{\left(\frac{\pi}{2\ln(2)}\right)^4 - 4 \cdot \left(\frac{1}{K}\right)^2 \cdot \left(\frac{\pi}{2\ln(2)}\right)^2}}{2 \cdot \left(\frac{1}{K}\right)^2}$$

wherein K is the K-factor of the resolution filter, while the K-factor is defined by the equation $$f(t) = \frac{1}{K} \cdot B_{res}^2 \cdot t$$

and f(t) is a variable frequency linear with time t, which is supplied to a mixer coupled in series with the spectrum analyzer.

5. The spectrum analyzer according to claim 4, wherein the constant $C_5$ equals $$C_5 = \frac{\pi^2}{2\ln(2)} \cdot \frac{1}{T_{used}^2}$$

wherein $T_{used}=1/B_{used}$.

6. A spectrum analyzer, comprising:

a mixer for mixing a complex conjugate input signal v*(t) into a base band signal x(t); and a resolution filter coupled to an output of the mixer for filtering the base band signal for a narrow band, said resolution filter having either a complex pulse response $h_{used}(t) = C_1 \cdot e^{-C_2 \cdot t^2} \cdot e^{-C_3 \cdot t^2}$ or a real pulse response $h_{used}(t) = C_4 \cdot e^{-C_5 \cdot t^2}$, in which $C_1$, $C_2$, $C_3$, $C_4$ and $C_5$ are constants, wherein:

constant $C_3$ equals $$C_3 = \frac{\pi}{K} \cdot B_{res}^2;$$

constant $C_4$ equals $$C_4 = \sqrt{\frac{B_{res}}{B_{used}}} \cdot \sqrt{\frac{\pi}{2\ln(2)}} \cdot B_{used};$$

$B_{res}$ is a bandwidth of the resolution filter;

$B_{used}$ is defined by:

$$\frac{B_{res}^2}{B_{used}^2} = \frac{\left(\frac{\pi}{2\ln(2)}\right)^2 - \sqrt{\left(\frac{\pi}{2\ln(2)}\right)^4 - 4 \cdot \left(\frac{1}{K}\right)^2 \cdot \left(\frac{\pi}{2\ln(2)}\right)^2}}{2 \cdot \left(\frac{1}{K}\right)^2};$$

K is a K-factor of the resolution filter, while the K factor is defined by the equation $$f(t) = \frac{1}{K} \cdot B_{res}^2 \cdot t; \quad \text{and}$$

f(t) is a variable frequency linear with time t, that is supplied to a mixer coupled in series with the resolution filter of the spectrum analyzer.

\* \* \* \* \*